United States Patent
Chan et al.

(10) Patent No.: US 11,043,920 B2
(45) Date of Patent: Jun. 22, 2021

(54) WIDEBAND DOHERTY HIGH EFFICIENCY POWER AMPLIFIER

(71) Applicant: City University of Hong Kong, Kowloon (HK)

(72) Inventors: Wing Shing Chan, Kowloon (HK); Xin Yu Zhou, Kowloon (HK); Shao Yong Zheng, Guangzhou (HK); Derek Ho, Diamond Hill (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/362,788

(22) Filed: Mar. 25, 2019

(65) Prior Publication Data
US 2020/0313623 A1    Oct. 1, 2020

(51) Int. Cl.
*H03F 3/68* (2006.01)
*H03F 1/02* (2006.01)
*H03F 3/21* (2006.01)

(52) U.S. Cl.
CPC ........... *H03F 1/0288* (2013.01); *H03F 3/211* (2013.01); *H03F 2200/336* (2013.01); *H03F 2200/387* (2013.01); *H03F 2200/423* (2013.01); *H03F 2200/451* (2013.01); *H03F 2203/21139* (2013.01)

(58) Field of Classification Search
CPC ........ H03F 1/0288; H03F 3/211; H03F 3/602; H03F 3/607; H03F 3/60; H03F 3/604
USPC ...................... 330/124 R, 286.295
See application file for complete search history.

(56) References Cited

U.S. PATENT DOCUMENTS

| | | | |
|---|---|---|---|
| 5,939,939 A * | 8/1999 | Gaynor | H03F 3/602 330/124 R |
| 6,861,907 B2 * | 3/2005 | Gotou | H03F 1/0288 330/286 |
| 9,917,551 B2 | 3/2018 | McLaren | |
| 9,923,523 B2 | 3/2018 | Lehtola | |
| 10,033,335 B1 * | 7/2018 | Chan | H03F 1/56 |
| 10,038,461 B2 | 7/2018 | Briffa et al. | |
| 10,063,190 B2 | 8/2018 | Pham et al. | |
| 10,084,413 B2 | 9/2018 | Su et al. | |
| 10,090,810 B2 | 10/2018 | Heijden et al. | |
| 10,103,690 B2 | 10/2018 | Yanduru | |
| 10,116,266 B2 | 10/2018 | Takagi | |
| 10,122,334 B2 | 11/2018 | Akbarpour et al. | |
| 10,224,878 B2 * | 3/2019 | Wang | H03F 3/195 |

(Continued)

*Primary Examiner* — Khanh V Nguyen
(74) *Attorney, Agent, or Firm* — Renner Kenner Greive Bobak Taylor & Weber

(57) ABSTRACT

A Doherty power amplifier having a main power amplification device and an auxiliary power amplification device arranged in parallel with the main power amplification device includes a load modulation circuit having a harmonic injection circuit connected with respective outputs of the main power amplification device and the auxiliary power amplification device. The harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation.

35 Claims, 12 Drawing Sheets

(56) References Cited

U.S. PATENT DOCUMENTS

2015/0295542 A1* 10/2015 Moronval ................. H03F 3/19
  455/561
2019/0312552 A1* 10/2019 Chan ..................... H03F 1/0288

* cited by examiner

WIDEBAND DOHERTY HIGH EFFICIENCY POWER AMPLIFIER

TECHNICAL FIELD

The invention relates to a Doherty power amplifier.

BACKGROUND

Modern fourth generation (4G) wireless communication devices and systems and Future (5G or above) wireless communication devices and systems use modulated signals with high peak to average power ratios (PAPRs). This causes a large variation in the instantaneous output power. In some of these applications, multi-input multi-output and carrier aggregation techniques are also used.

As a result, Doherty power amplifiers (DPAs) in base stations of these wireless communication devices and systems have to maintain high efficiency over a large dynamic range in wideband frequency range.

SUMMARY OF THE INVENTION

It is an object of the invention to address the above needs, to overcome or substantially ameliorate the above disadvantages or, more generally, to provide an improved Doherty power amplifier, in particular one that has high efficiency over a wide frequency range.

In accordance with a first aspect of the invention, there is provided a Doherty power amplifier having: a main power amplification device with an output; an auxiliary power amplification device with an output, and arranged in parallel with the main power amplification device; and a load modulation circuit having a harmonic injection circuit connected with respective outputs of the main power amplification device and the auxiliary power amplification device. The harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation. In this aspect, the main power amplification device can be referred to as a "carrier device"; the auxiliary power amplification device can be referred to as a "peaking device".

In one embodiment of the first aspect, the main power amplification device, when operated at saturation, has a relative current ratio defined by: a second harmonic current generated by the main power amplification device divided by a second harmonic current generated by the auxiliary power amplification device. The harmonic injection circuit is arranged such that the relative current ratio of the main power amplification device is larger than 1.

In a preferred embodiment of the first aspect, the auxiliary power amplification device, when operated at saturation, has a relative current ratio defined by: a second harmonic current generated by the auxiliary power amplification device divided by a second harmonic current generated by the main power amplification device. The harmonic injection circuit is arranged such that the relative current ratio of the auxiliary power amplification device is less than 1.

In one embodiment of the first aspect, the harmonic injection circuit is arranged to provide a phase shift of substantially 180°. However, in some embodiments, the harmonic injection circuit is arranged to provide any phase shift that enables ±90° phase dispersion.

In one embodiment of the first aspect, the harmonic injection circuit includes a π-type circuit topology. However, in some embodiments, the harmonic injection circuit can have a different circuit topology that provides wideband high pass or band pass frequency response.

In one embodiment of the first aspect, the load modulation circuit further includes: a main fundamental impedance inverter connected with the main power amplification device; and an auxiliary fundamental impedance inverter connected with the auxiliary power amplification device. The harmonic injection circuit is connected between the main fundamental impedance inverter and the auxiliary fundamental impedance inverter.

In one embodiment of the first aspect, the main fundamental impedance inverter has an L-type circuit topology.

In one embodiment of the first aspect, the auxiliary fundamental impedance inverter has an L-type circuit topology.

In a preferred embodiment of the first aspect, the load modulation circuit further includes a phase compensation circuit, connected between the main fundamental impedance inverter and the auxiliary fundamental impedance inverter, for compensating an inherent phase difference (e.g., 90°) between the main power amplification device and the auxiliary power amplification device.

In one embodiment of the first aspect, the phase compensation circuit includes a single-end coupled transmission line section. The single-end coupled transmission line section has an input impedance; the main power amplification device has a main load impedance at saturation; and the auxiliary power amplification device has an auxiliary load impedance at saturation. The input impedance, the main load impedance at saturation, and the auxiliary load impedance at saturation are substantially identical.

In one embodiment of the first aspect, the phase compensation circuit further includes a first transmission line section and a second transmission line section, the single-end coupled transmission line section being connected between the first transmission line section and the second transmission line section.

In one embodiment of the first aspect, the phase compensation circuit is formed by a continuous transmission line.

In one embodiment of the first aspect, the first transmission line section is elongated, and the second transmission line section is elongated.

In one embodiment of the first aspect, the first and second transmission line sections are arranged in parallel, either offset or collinear.

In one embodiment of the first aspect, the single-end coupled transmission line section includes: a third transmission line section with a first end and a second end; and a fourth transmission line section with a first end and a second end, arranged adjacent and in parallel with the third transmission line section. The first end of the third transmission line section is directly connected with the first transmission line section. The first end of the fourth transmission line section is directly connected with the second transmission line section. The second end of the third transmission line section and the second end of the fourth transmission line section are directly connected with each other to provide the single-end coupling.

In one embodiment of the first aspect, the third transmission line section generally extends perpendicularly from the first transmission line section; and the fourth transmission line section generally extends perpendicularly from the second transmission line section.

In one embodiment of the first aspect, the main power amplification device is biased to operate as a Class AB amplifier, in particular a Deep Class AB amplifier. The main power amplification device preferably includes a transistor.

In one embodiment of the first aspect, the auxiliary power amplification device is biased to operate as a Class C amplifier, in particular a Deep Class C amplifier. The auxiliary power amplification device preferably includes a transistor.

In accordance with a second aspect of the invention there is provided a Doherty power amplifier having a main power amplification device biased to operate as a Class AB amplifier (in particular a Deep Class AB amplifier); and an auxiliary power amplification device biased to operate as a Class C amplifier (in particular a Deep Class C amplifier), arranged in parallel with the main power amplification device. The main power amplification device has an output and the auxiliary power amplification device has an output. The Doherty power amplifier also includes a load modulation circuit. The load modulation circuit has a main fundamental impedance inverter connected with the main power amplification device; and an auxiliary fundamental impedance inverter connected with the auxiliary power amplification device. The load modulation circuit also has a harmonic injection circuit connected with respective outputs of the main power amplification device and the auxiliary power amplification device and connected between the main fundamental impedance inverter and the auxiliary fundamental impedance inverter. The harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation. The load modulation circuit also has a phase compensation circuit with a single-end coupled transmission line section, connected between the main fundamental impedance inverter and the auxiliary fundamental impedance inverter, for compensating an inherent phase difference between the main power amplification device and the auxiliary power amplification device. In this aspect, the main power amplification device can be referred to as a "carrier device"; the auxiliary power amplification device can be referred to as a "peaking device".

In one embodiment of the second aspect, the main power amplification device, when operated at saturation, has a relative current ratio defined by: a second harmonic current generated by the main power amplification device divided by a second harmonic current generated by the auxiliary power amplification device; and the auxiliary power amplification device, when operated at saturation, has a relative current ratio defined by: a second harmonic current generated by the auxiliary power amplification device divided by a second harmonic current generated by the main power amplification device. The harmonic injection circuit is arranged such that the relative current ratio of the main power amplification device is larger than 1 and the relative current ratio of the auxiliary power amplification device is less than 1.

In one embodiment of the second aspect, the harmonic injection circuit is arranged to provide a phase shift of substantially 180°. However, in some embodiments, the harmonic injection circuit is arranged to provide any phase shift that enables ±90° phase dispersion.

In one embodiment of the second aspect, the harmonic injection circuit includes a π-type circuit topology. However, in some embodiments, the harmonic injection circuit can have a different circuit topology that provides wideband high pass or band pass frequency response.

In one embodiment of the second aspect, the main fundamental impedance inverter has an L-type circuit topology; and the auxiliary fundamental impedance inverter has an L-type circuit topology.

In one embodiment of the second aspect, the single-end coupled transmission line section has an input impedance; the main power amplification device has a main load impedance at saturation; and the auxiliary power amplification device has an auxiliary load impedance at saturation. The input impedance, the main load impedance at saturation, and the auxiliary load impedance at saturation are substantially identical.

In one embodiment of the second aspect, the phase compensation circuit further includes a first transmission line section and a second transmission line section, the single-end coupled transmission line section being connected between the first transmission line section and the second transmission line section. The first and second transmission line sections are preferably arranged in parallel, either offset or collinear.

In one embodiment of the second aspect, the single-end coupled transmission line section includes: a third transmission line section with a first end and a second end; and a fourth transmission line section with a first end and a second end, arranged adjacent and in parallel with the third transmission line section. The first end of the third transmission line section is directly connected with the first transmission line section. The first end of the fourth transmission line section is directly connected with the second transmission line section. The second end of the third transmission line section and the second end of the fourth transmission line section are directly connected with each other to provide the single-end coupling.

In one embodiment of the second aspect, the third transmission line section generally extends perpendicularly from the first transmission line section; and the fourth transmission line section generally extends perpendicularly from the second transmission line section.

In one embodiment of the second aspect, the phase compensation circuit is formed by a continuous transmission line.

In accordance with a third aspect of the invention, there is provided an electronic device including the Doherty power amplifier circuit of the first aspect or of the second aspect. The electronic device may be, for example, a communication device, in particular a wireless communication device. The wireless communication device may be for 4G, 5G, or higher order wireless communication devices. For example, the communication device can be a mobile phone, tablet, smart watch, IoT devices with communication function, etc.

In accordance with a fourth aspect of the invention, there is provided an electronic system including the Doherty power amplifier circuit of the first aspect or of the second aspect. The electronic system may be, for example, a communication system, in particular a wireless communication system. The wireless communication system may be for 4G, 5G, or higher order wireless communication systems. The electronic system can include a base station for wireless communication.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
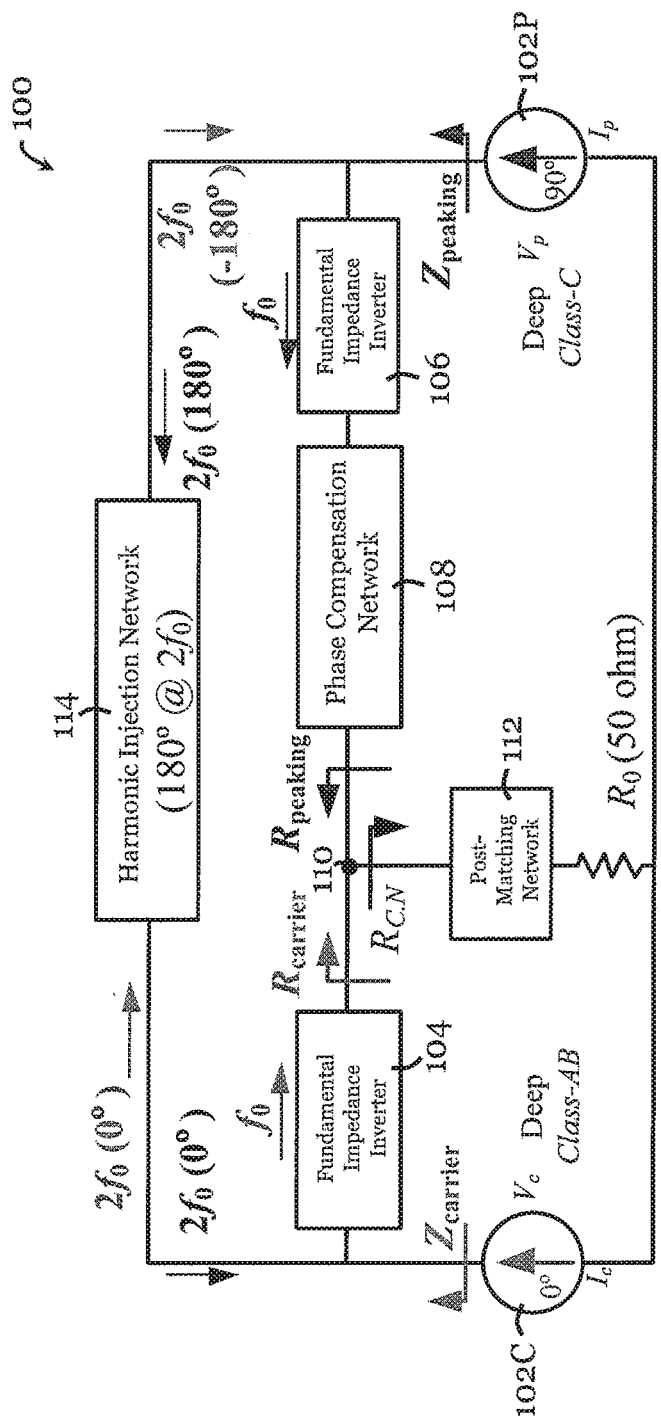
FIG. 1 is a simplified circuit diagram of a Doherty power amplifier in one embodiment of the invention.

FIG. 1 shows a high-level circuit diagram of a Doherty power amplifier 100 in one embodiment of the invention. As shown in FIG. 1, the amplifier 100 includes a main power amplification device, in the form of a carrier amplifier 102C, and an auxiliary power amplification device, in the form of a peaking amplifier 102P. The carrier amplifier 102C and the peaking amplifier 102P are arranged in parallel, and are two symmetrical drain biased active devices. In this embodiment, the carrier amplifier 102C is biased to operate as a Class AB amplifier (in particular a deep Class AB amplifier) and the peaking amplifier 102P is biased to operate as a Class C amplifier (in particular a deep Class C amplifier). Each of the carrier amplifier 102C and the peaking amplifier 102P is connected with a respective fundamental impedance inverter (FII) 104, 106. The fundamental impedance inverter 106 of the peaking amplifier 102P is further connected with a phase compensation network (PCN) 108. The phase compensation network 108 and the fundamental impedance inverter 104 of the carrier amplifier 102C are connected at a common node (combining node) 110, to which a post-matching network (PMN) 112 is connected. A harmonic injection network (HIN) 114 is connected between the two fundamental impedance inverters 104, 106. The harmonic injection network 114 is arranged to provide a phase shift to simultaneously modulate transfer of second harmonic components generated at the carrier amplifier 102C to the peaking amplifier 102P and transfer of second harmonic components generated at the peaking amplifier 102P to the carrier amplifier 102C, when the two amplifiers are operated at saturation. In this embodiment, the harmonic injection network 114 is arranged to provide a phase shift of substantially 180°.

In this embodiment, the phase for the carrier amplifier 102C at $f_o$ and $2f_o$ are both 0°, and the phase for the peaking amplifier 102P at $f_o$ and $2f_o$ are 90° and 180° respectively. The second harmonic current injected from the peaking amplifier 102P ($2f_o$, −180° to the carrier amplifier 102C has a phase of 0° ($2f_o$, 0°), which is the same as the second harmonic current generated by the carrier amplifier 102C itself. Likewise, the second harmonic current injected from the carrier amplifier 102C to the peaking amplifier 102P has the same phase as the second harmonic current generated by the peaking amplifier 102P itself.

In the Doherty power amplifier circuit 100 of FIG. 1, the fundamental load impedances of the carrier and peaking amplifiers 102C, 102P should satisfy the following requirements:

$$R_{carrier} \text{ at } f_o = R_L \text{ and } R_{peaking} \text{ at } f_o = \infty \text{ (at Back-off)} \quad (1)$$

$$R_{carrier} \text{ at } f_o = 2R_L \text{ and } R_{peaking} \text{ at } f_o = 2R_L \text{ (at Saturation)} \quad (2)$$

where $f_o$ is the fundamental frequency.

During operation at or below the back-off point, only the carrier amplifier 102C is conducting, $R_{carrier} = R_{C.N.} = R_L$ ($R_{C.N.}$ refers to the impedance at the signal combining node 110) and $R_{peaking}$ is infinite or substantially large to prevent power leakage from the circuit branch in which the carrier amplifier 102C is arranged. During operation at saturation, the carrier and peaking amplifiers 102C, 102P are both conducting. Therefore, $R_{carrier}$ and $R_{peaking}$ are both $2R_L$ in order to maintain $R_{C.N.}$ at $R_L$. The function of the phase compensation network 108 is to compensate for the phase shift, in this example 90° phase shift, between the carrier and peaking amplifiers 102C, 102P. In one embodiment, the impedance of the phase compensation network 108, or its phase compensation section, should be set to $2R_L$ in order to prevent power loss in the circuit branch in which the peaking amplifier 102P is arranged. After that, the post matching network 112 transforms the "real-to-real" impedance from system load ($R_o$) to combining node ($R_{C.N.}$).

Figure 2:
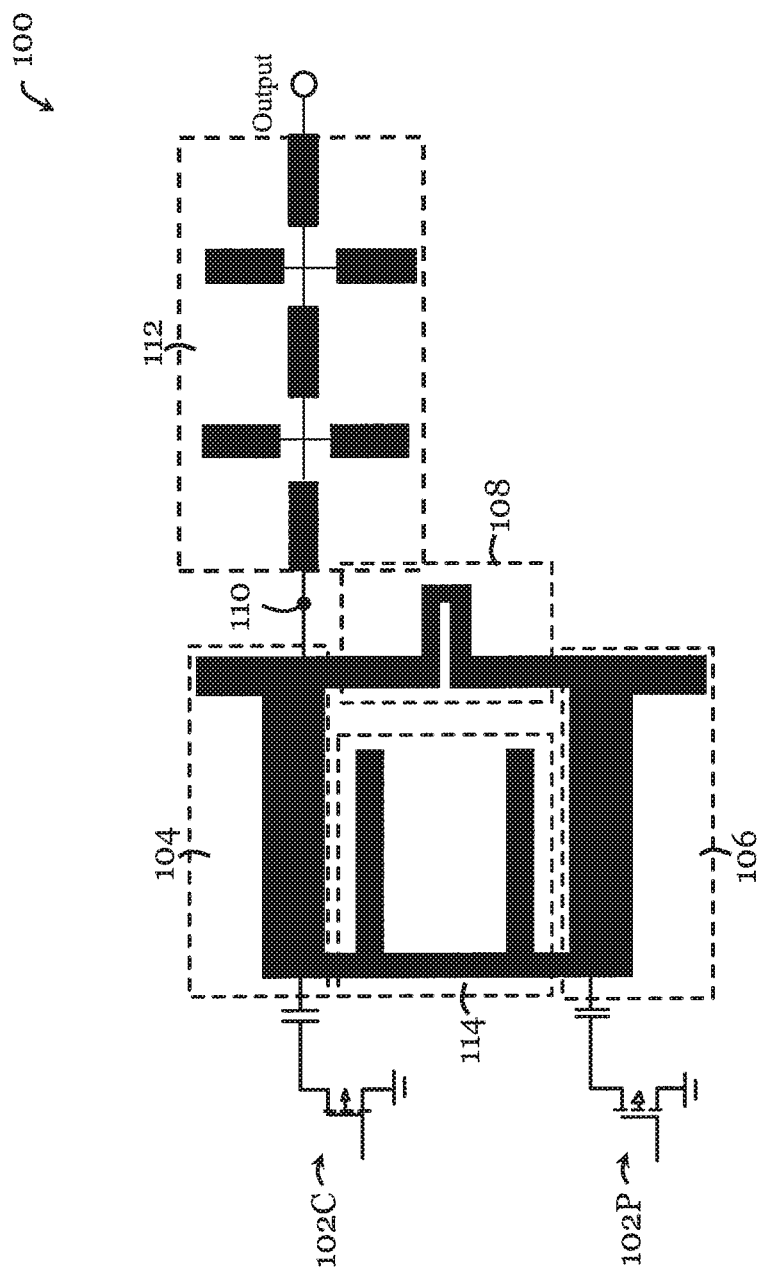
FIG. 2 is a simplified illustration of the output side network of the Doherty power amplifier of FIG. 1.
Figure 6:
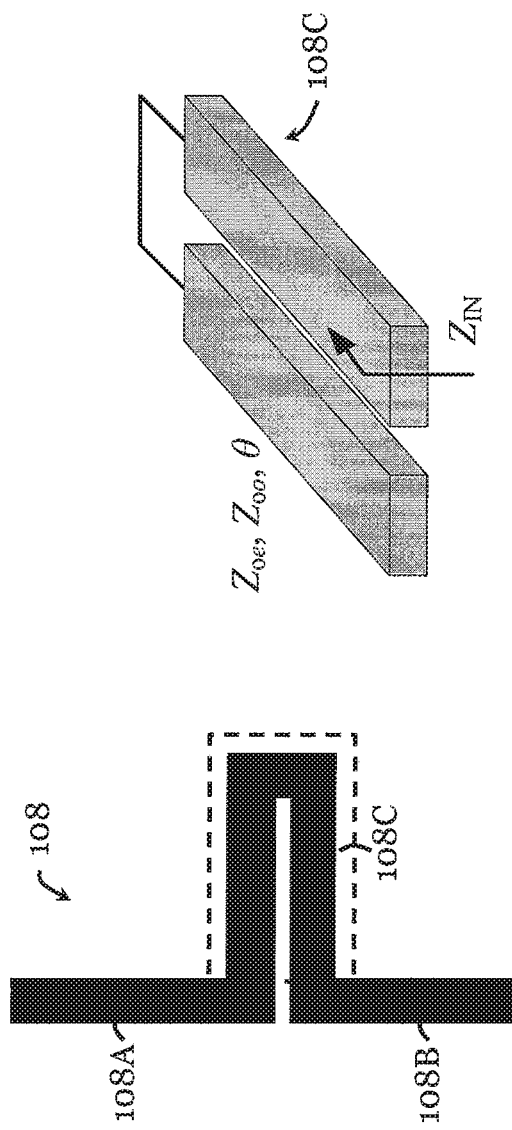
FIG. 6 is a schematic view of the phase compensation network of the Doherty power amplifier of FIG. 1.

FIG. 2 shows the circuit geometry of the output side network of the Doherty power amplifier 100 of FIG. 1 in one embodiment of the invention. As shown in FIG. 2, the carrier and peaking amplifiers 102C, 102P each include a biased transistor connected with a respective capacitor at the output. A fundamental impedance inverter 104 of the carrier amplifier 102C is connected with the dc block capacitor. The fundamental impedance inverter 104 of the carrier amplifier 102C has a L-type circuit topology. A fundamental impedance inverter 106 of the peaking amplifier 102P is connected with the dc block capacitor. The fundamental impedance inverter 106 of the peaking amplifier 102P has a L-type circuit topology. A harmonic injection circuit 114 is connected between the two fundamental impedance inverters 104, 106. The harmonic injection circuit 114 has a π-type circuit topology. A phase compensation network 108 is connected between the two fundamental impedance inverters 104, 106. The phase compensation network 108 includes a single-end coupled transmission line section for phase compensation (FIG. 6). The output of the fundamental impedance inverter 104 of the carrier amplifier 102C provides a combining node 110 to which a post-matching network 112 is connected. The post-matching network 112 has a high-order low pass topology. In the embodiment of FIG. 2, the fundamental impedance inverters 104, 106, the harmonic injection network 114, and the phase compensation network 108 form the load modulation network. The output side network includes the load modulation network and the post matching network 112.

In this embodiment, the gate bias selections (deep Class AB for carrier amplifier 102C and deep Class C for peaking amplifier 102P) provide higher back-off efficiency due to the smaller conduction angle. However, in this embodiment, such gate bias selections and the π-type harmonic injection network 114 can cause a few problems that may occur simultaneously.

The first problem relates to deteriorated output back-off (OBO) range of the Doherty power amplifier 100. According to the output back-off (OBO) range calculation, its value can be expressed as $$OBO(\text{dB}) = 10 \log [(1+\alpha)\beta_d] \quad (3)$$

$$\alpha = P_{sat,p}/P_{sat,c} \quad (4)$$

$$\beta_d = P_{sat,c}/P_{bac-off,c} \quad (5)$$

where $P_{sat,c}$ and $P_{sat,p}$ refer to the saturated carrier and peaking fundamental power respectively, $P_{back-off,c}$ refer to the back-off carrier fundamental power. When the peaking amplifier is biased in deep Class-C, $P_{sat,p}$ is limited. Other the other hand, $P_{sat,c}$ is not reduced substantially even when biased in deep Class-AB. Thus, the value of α is decreased and, correspondingly, the OBO range deteriorates.

The second problem relates to reduced linearity of the Doherty power amplifier 100. With such gain gate bias selections, the Doherty power amplifier 100 approaches compression earlier (AM-AM distortion). Also, the phase distortion (AM-PM distortion) of the peaking and carrier amplifiers worsens when the conduction angles is reduced.

The third problem relates to reduced operating bandwidth of the Doherty power amplifier 100. With the use of a π-type harmonic injection network in the Doherty power amplifier 100, mismatch at the fundamental frequency would occur, which reduces operating bandwidth of the Doherty power amplifier 100.

The following considers a solution to the first problem, by viewing waveforms of the peaking and carrier amplifiers as a result of the harmonic injection. With appropriate use of the 180° phase injection, the second harmonic components (2$f_o$) generated by the peaking and carrier amplifiers can be mutually injected into each other. Accordingly, the corresponding voltage V and current I amplitude waveforms can be expressed as:

$$v_D(\omega t) = V_{DD} + v_1 \cos(\omega t) + v_2 \cos(2\omega t) + \alpha_{inj\_c/p} \cos(2\omega t) = V_{DD} + v_1 \cos(\omega t) + (v_2 + \alpha_{inj\_c/p})\cos(2\omega t) \quad (6)$$

$$i_D(\omega t) = I_{DD} - i_1 \cos(\omega t) - i_2 \cos(2\omega t) + b_{inj\_c/p} \cos(2\omega t) = I_{DD} - i_1 \cos(\omega t) + (b_{inj\_c/p} - i_2)\cos(2\omega t) \quad (7)$$

where $V_{DD}$ and $I_{DD}$ are the dc components, $v_n$ and $i_n$ (n=1, 2) are the peaking/carrier amplifier's self-generated voltage and current amplitudes of $f_o$, $2f_o$, $\alpha_{inj\_c/p}$ and $b_{inj\_c/p}$ are the voltage and current amplitudes of the injected $2f_o$ component from the other device, respectively. For the voltage waveform, the effect of injected $2f_o$ voltage on amplitude can be observed more clearly by an example, where the parameters of Equation (6) are set as follows:

$$V_{DD}=0, v_1=1, v_2=0.3 \text{ and } \alpha_{inj\_c/p}=0.2 \quad (8)$$

Figure 3:
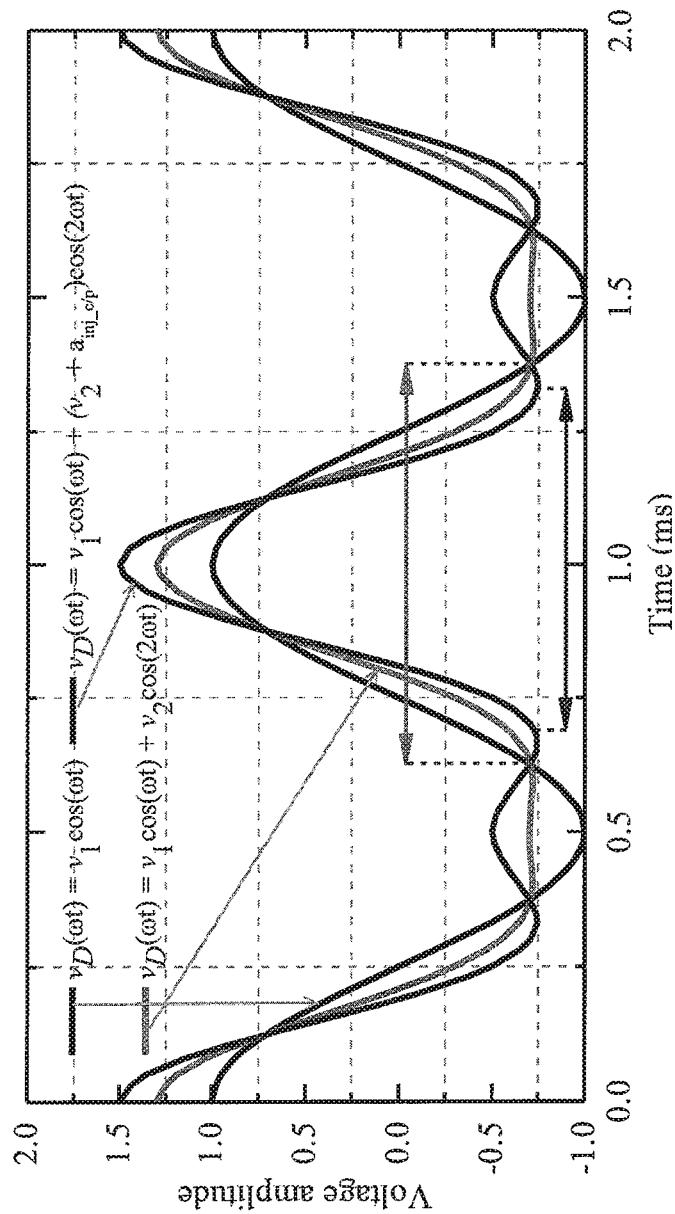
FIG. 3 is a graph showing exemplary voltage waveforms of one of the main power amplification device or the auxiliary power amplification device under 180° harmonic injection and non-harmonic injection from the other of the main power amplification device or the auxiliary power amplification device in one embodiment of the invention.

FIG. 3 shows the voltage waveforms of the active device (peaking or carrier amplifier) under the set parameters. The purpose of second harmonic injection is to shape the amplitude of the fundamental voltage swing with respect to a non-injected design. In particular, when only $v_1$ is present, the normalized sinusoidal waveform with peak amplitude of 1 can be obtained (Black line). When the device's (peaking or carrier) self-generated second harmonic $v_2$ is included, an increase in a positive amplitude of 0.3 and a flattening of the bottom waveform occurs (Red line). With $\alpha_{inj\_c/p}$ further injected, a further increase in voltage in the upper half (1.5) of the sinusoidal voltage waveform and a slight rippling in the flattened lower half are achieved.

For the current waveforms, their shapes are also modulated by the injected $2f_o$ components. A parameter called "relative current ratio (RCT)" is defined to show the effects of the injected current components. The relative current ratio is expressed as $$\text{RCT} = I_{self\_c/p}(2f_o)/I_{inj\_p/c}(2f_o) \quad (9)$$

where $I_{self\_c/p}(2f_o)$ is the device self-generated $2f_o$ component and $I_{inj\_p/c}(2f_o)$ is the injected $2f_o$ component from the other device.

To simulate and hence compare the relative waveforms for the two RCT conditions, the current amplitude parameters are set as follows:

$$I_{DD}=0, i_1=1, i_2=0.3 \text{ and } b_{inj\_c/p}=0.2(\text{RCT}>1) \quad (10)$$

$$I_{DD}=0, i_1=1, i_2=0.2 \text{ and } b_{inj\_c/p}=0.3(\text{RCT}<1) \quad (11).$$

When the peaking and carrier amplifiers both reach saturation, they both generate large second harmonic components, which are used to advantage as no additional components are necessary. The second harmonic components generated by the peaking amplifier (180°) are injected into the drain of carrier amplifier with a phase of 0° through the harmonic injection network.

Figure 4:
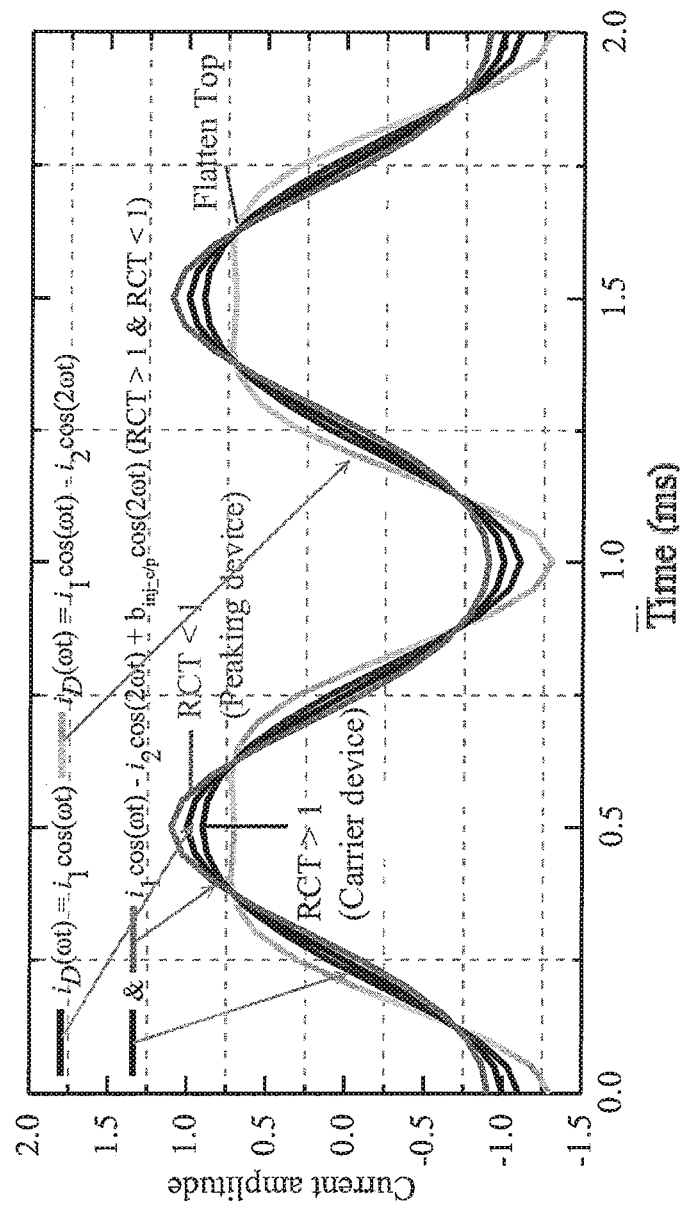
FIG. 4 is a graph showing exemplary current waveforms of one of the main power amplification device or the auxiliary power amplification device under 180° harmonic injection and non-harmonic injection from the other of the main power amplification device or the auxiliary power amplification device in one embodiment of the invention.

In FIG. 4, the current waveform of the active device (peaking or carrier amplifier) under 180° harmonic injection and non-harmonic injection. Similar to the voltage waveform, when only it is considered, for a pure sinusoidal waveform, the normalized peak amplitude of 1 is obtained (Black line). With the self-generated current $i_2$ included, there is a decrease in amplitude and a flattening of the waveform. For the condition RCT>1, the current bifurcation caused by the transistor's self-generated $2f_o$ components can be mitigated, but the amplitude increase is minimal. For the condition where RCT<1, the flattened waveform is fully mitigated and the amplitude is increased.

In this embodiment, to enable the peaking amplifier to have enough power to compensate for a decrease in OBO range, the injected condition of RCT<1 is chosen for the peaking device. Meanwhile, $I_{inj\_p}(2f_o)$ is inevitably smaller than $I_{self\_c}(2f_o)$, namely, RCT>1 is used for the carrier amplifier. Consequently, the enhancement in current amplitude is limited in the carrier amplifier.

Table I shows $P_{sat,p}$, $P_{sat,c}$, and its corresponding a of the Doherty power amplifier of FIG. 1 with and without the 180° HIN in one embodiment of the invention. As shown in the table, the problem of decreased α can only be solved when the following condition is satisfied.

TABLE I $P_{SAT,P}$, $P_{SAT,C}$, CORRESPONDING α OF DOHERTY POWER AMPLIFIER WITH AND WITHOUT 180° HARMONIC INJECTION NETWORK (HIN)

| | Doherty power amplifier with 180° HIN | Doherty power amplifier without 180° HIN |
|---|---|---|
| $P_{SAT,C}$ | $0.5*(V_{1c} + V_{2c} + a_{inj\_p})(i_{1c} - i_{2c} + b_{inj\_p})$ | $0.5*(V_{1c} + V_{2c})(i_{1c} - i_{2c})$ |
| $P_{SAT,P}$ | $0.5*(V_{1p} + V_{2p} + a_{inj\_c})(i_{1p} - i_{2p} + b_{inj\_c})$ | $0.5*(V_{1p} + V_{2p})(i_{1p} - i_{2p})$ |
| α | $\dfrac{(V_{1p} + V_{2p} + a_{inj\_c})(i_{1p} - i_{2p} + b_{inj\_c})}{(V_{1c} + V_{2c} + a_{inj\_p})(i_{1c} - i_{2c} + b_{inj\_p})}$ | $\dfrac{(V_{1p} + V_{2p})(i_{1p} - i_{2p})}{(V_{1c} + V_{2c})(i_{1c} - i_{2c})}$ |

$$\frac{(V_{1p} + V_{2p} + a_{inj\_c})(i_{1p} - i_{2p} + b_{inj\_c})}{(V_{1c} + V_{2c} + a_{inj\_p})(i_{1c} - i_{2c} + b_{inj\_p})} > \frac{(V_{1p} + V_{2p})(i_{1p} - i_{2p})}{(V_{1c} + V_{2c})(i_{1c} - i_{2c})} \quad (12)$$

In practice, $\alpha_{inj\_c} = \alpha_{inj\_p}$ and $V_{1p} + V_{2p} = V_{1c} + V_{2c}$ cannot be perfectly satisfied due to the different gate bias settings and different matching networks in the carrier and peaking amplifiers. In Equation (13), both $\alpha_{inj\text{-}c}$ and $\alpha_{inj\text{-}p}$ are relatively small compared to $(V_{1p}+V_{2p})$ and $(V_{1c}+V_{2c})$. Hence, the influence of $\alpha_{inj\text{-}c}$ and $\alpha_{inj\text{-}p}$ on the voltage amplitude ratio is negligible. Therefore, the voltage ratio of the Doherty power amplifier in this embodiment remains substantially unchanged, and is given by $$\frac{(V_{1p} + V_{2p} + a_{inj\_c})}{(V_{1c} + V_{2c} + a_{inj\_p})} \approx \frac{(V_{1p} + V_{2p})}{(V_{1c} + V_{2c})} \quad (13)$$

Hence, the condition for Equation (12) can be simplified to $$\frac{(i_{1p} - i_{2p} + b_{inj\_c})}{(i_{1c} - i_{2c} + b_{inj\_p})} > \frac{(i_{1p} - i_{2p})}{(i_{1c} - i_{2c})} \quad (14)$$

It can be seen that the second harmonic injected current from the carrier amplifier has to be higher than the second harmonic injected current from the peaking amplifier for obtaining the waveform shown in FIG. 4. This condition can be illustrated as:

$$b_{inj\_c} > b_{inj\_p} \quad (15)$$

In conventional Doherty power amplifier, the second harmonic current of the carrier amplifier is much lower than that of the peaking amplifier. This limits what can be achieved according to Equation (15). In the Doherty power amplifier of this embodiment, the second harmonic current amplitude of the carrier amplifier is arranged to be higher than that of the peaking amplifier when the carrier and peaking amplifiers are selected for deep Class-AB and deep Class C mode, and through the harmonic injection network.

$$I_{2\_carrier} \geq I_{2\_peaking} \quad (16)$$

The principle of the above described harmonic injection technique includes current waveform shaping. It should be noted that the odd harmonics are mainly used to shape the voltage waveform, which is not the main concern in the Doherty power amplifier of this embodiment. In other words, the odd harmonics higher than the third harmonic are negligible and need not be considered.

Following from the above, the mathematical expression of Pa can be calculated as $$\beta_d = \left(1 + \frac{a_{inj\_p}}{v_{1c} + v_{2c}}\right)\left(1 + \frac{b_{inj\_p}}{i_{1c} - i_{2c}}\right)(1 + \alpha) \quad (17)$$

There are three bracketed terms in Equation (17). The values of the first and second bracketed terms are always larger than 1 due to the presence of $\alpha_{inj\_p}$ and $b_{inj\_p}$. The enhanced α also results in an increase of $\beta_d$, which, to some extent, compensates for the decreased OBO range.

Figure 5:
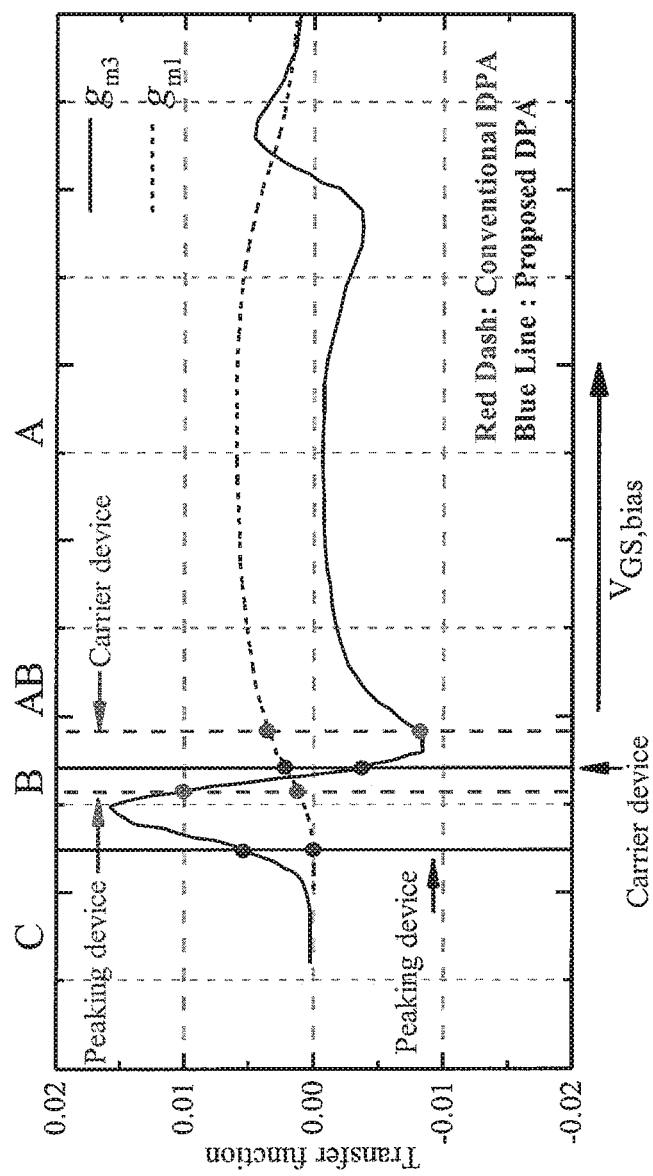
FIG. 5 is a graph showing transconductance $g_{mn}$ at different gate bias ($V_{GS}$) highlighting the operation points of the Doherty power amplifier in one embodiment of the invention.

Next, considers a solution to the second problem, by considering FIG. 5 which shows a graph showing transconductance gin at different gate bias ($V_{GS}$), highlighting the operation points of the Doherty power amplifier in one embodiment of the invention.

As shown in FIG. 5, for the carrier amplifier, the absolute value of $g_{m1}$ in the Doherty power amplifier of the present embodiment is smaller than that for a conventional Doherty power amplifier. As a result, $C_{gd} \cdot g_{m1}$ is smaller, and this reduces the variation of AM-PM distortion. Its output voltage phase can be rewritten as $$\Delta\text{Phase}(V_{Load\_c})\downarrow = \tan^{-1}\left(\frac{R_s + r_g}{X_s - \dfrac{1}{\omega(C_{gs} - (C_{gd}g_{m1})\downarrow Z_{carrier})}}\right), \quad (18)$$

$$Z_{carrier} \in (2R_{opt}, R_{opt})$$

On the other hand, the peaking device begins to conduct after the back-off point along with a large change in impedance, which could also lead to a large AM-PM distortion.

$$\Delta\text{Phase}(V_{Load\_p})\downarrow = \tan^{-1}\left(\frac{R_s + r_g}{X_s - \dfrac{1}{\omega(C_{gs} - (C_{gd}g_{m1})\downarrow Z_{peaking})}}\right), \quad (19)$$

$$Z_{peaking} \in (\infty, R_{opt})$$

In this respect, the absolute value of $g_{m1}$ for the peaking device in the Doherty power amplifier of the present embodiment is nearly zero, and which is smaller than that of the conventional Doherty power amplifier. This reduces AM-PM distortion for the peaking device.

Finally, the third problem is addressed by the phase compensation network 108 in one embodiment of the invention, as illustrated in FIG. 6. As shown in FIG. 6, the phase compensation circuit 108 is arranged to increase the reduced bandwidth caused by the π-type circuit harmonic injection network 114. In this embodiment, the phase compensation circuit 108 is formed by a continuous transmission line.

The phase compensation circuit 108 includes a first elongated transmission line section 108A, a second elongated transmission line section 108B extending generally collinearly with the first elongated transmission line section 108A, and a single-end coupled transmission line section 108C connected between the first transmission line section 108A and the second transmission line section 108B. The single-end coupled transmission line section 108C is substantially symmetrical. The single-end coupled transmission line section 108C includes a third transmission line section with a first end and a second end; and a fourth transmission line section with a first end and a second end, arranged adjacent and in parallel with the third transmission line section. The third transmission line section generally extends perpendicularly from the first transmission line section 108A. The fourth transmission line section generally extends perpendicularly from the second transmission line section 108B. The first end of the third transmission line section is directly connected with the first transmission line section 108A. The first end of the fourth transmission line section is directly connected with the second transmission line section 108B. The second end of the third transmission line section and the second end of the fourth transmission line section are directly connected with each other to provide the single-end coupling. In FIG. 6, the coupled transmission line section 108C has even and odd mode impedances $Z_{oe}$, $Z_{oo}$ respectively, and an electrical length of θ. In this embodiment, $Z_{IN}$ (input impedance of coupled section) is the square root of $Z_{oe}Z_{oo}$ and its value is $2R_L$ for lossless power transformation. In this example, the ratio between even and odd mode impedance of the coupled transmission line section 108C is defined by ρ. Moreover, coupling C and ρ are related by:

$$C = -20\log\frac{\rho-1}{\rho+1} = -20\log\left(1 - \frac{2}{\rho+1}\right). \quad (20)$$

From Equation (20), it can be determined that C is monotonically increasing with an increase in ρ. Here, when the gap distance of a coupled section 108C is reduced, $Z_{oe}$ increases and $Z_{oo}$ is reduced (resulting in a larger ρ). A strong coupling C in the phase compensation network 108 leads to a smaller external Q factor ($Q_E$) for the entire peaking branch (the circuit branch in which the peaking amplifier is arranged). On the other hand, this also enables $Z_{IN}$ to be unchanged to satisfy the impedance requirement of the phase compensation network. Consequently, frequency behaviours of $Z_{peaking}$ when viewed on the Smith chart have a smaller variation at saturation. As a result, load modulation can be achieved over a wider frequency range.

Figure 7:
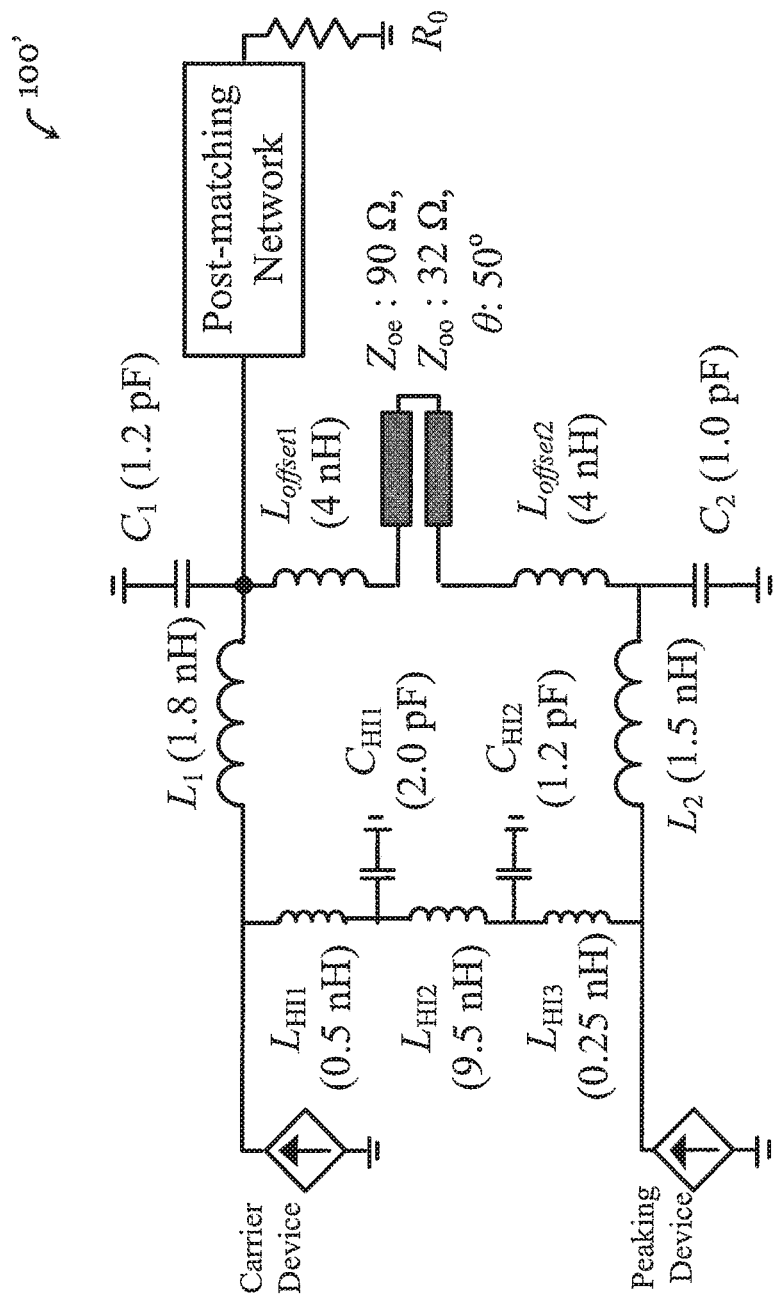
FIG. 7 is a circuit diagram illustrating the equivalent circuit of the load modulation network of the Doherty power amplifier of FIG. 1.

FIG. 7 shows the equivalent circuit 100' of the load modulation network of the Doherty power amplifier 100 of FIG. 1. The impedance inverters of the carrier and peaking amplifiers can be viewed as an LC tank circuit ($L_1$=1.8 nH, $C_1$=1.2 pF, $L_2$=1.5 nH, $C_2$=1.0 pF respectively). Three inductors ($L_{H1}$=0.5 nH, $L_{H2}$=9.5 nH, $L_{H3}$=0.25 nH,) in parallel with two grounded capacitor ($C_{H1}$=2.0 pF, $C_{H1}$=1.2 pF,) provide the harmonic injection network. Furthermore, the phase compensation network is comprised of two inductors (4 nH) in series with the single-end coupled line ($Z_{oe}$=90Ω, $Z_{oo}$=32Ω, θ=50°.

Figure 8:
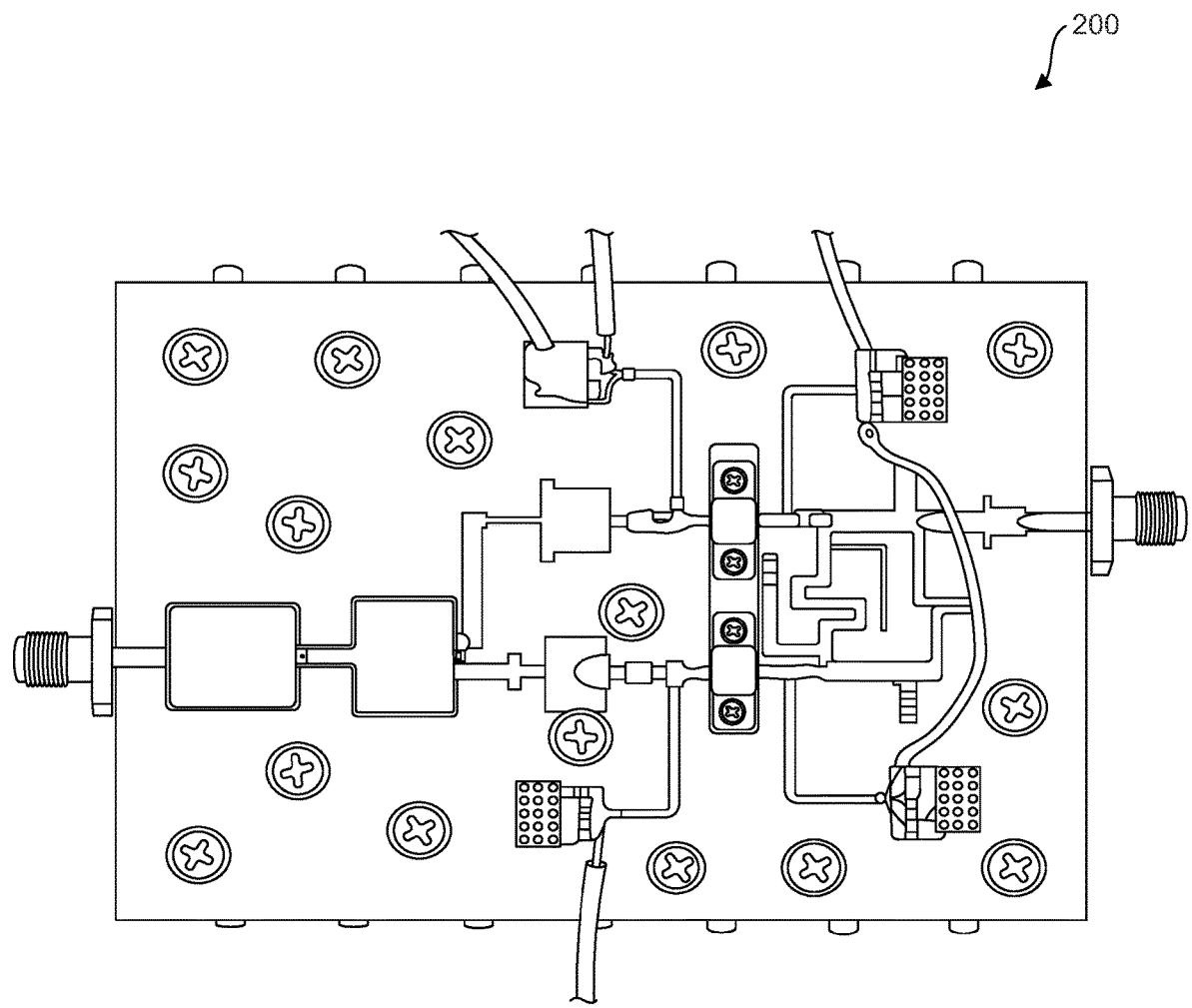
FIG. 8 is a photo showing a Doherty power amplifier fabricated based on the Doherty power amplifier of FIG. 1.

FIG. 8 shows an efficiency enhanced Doherty power amplifier 200 with broad bandwidth designed and fabricated based on the power amplifier 100 embodiment of FIG. 1 using Rogers substrate 4003C (ε=3.38, h=0.813 mm). Experiments and test were performed on the fabricated Doherty power amplifier 200, results of which are shown in the graphs of FIGS. 9 to 12.

Figure 9:
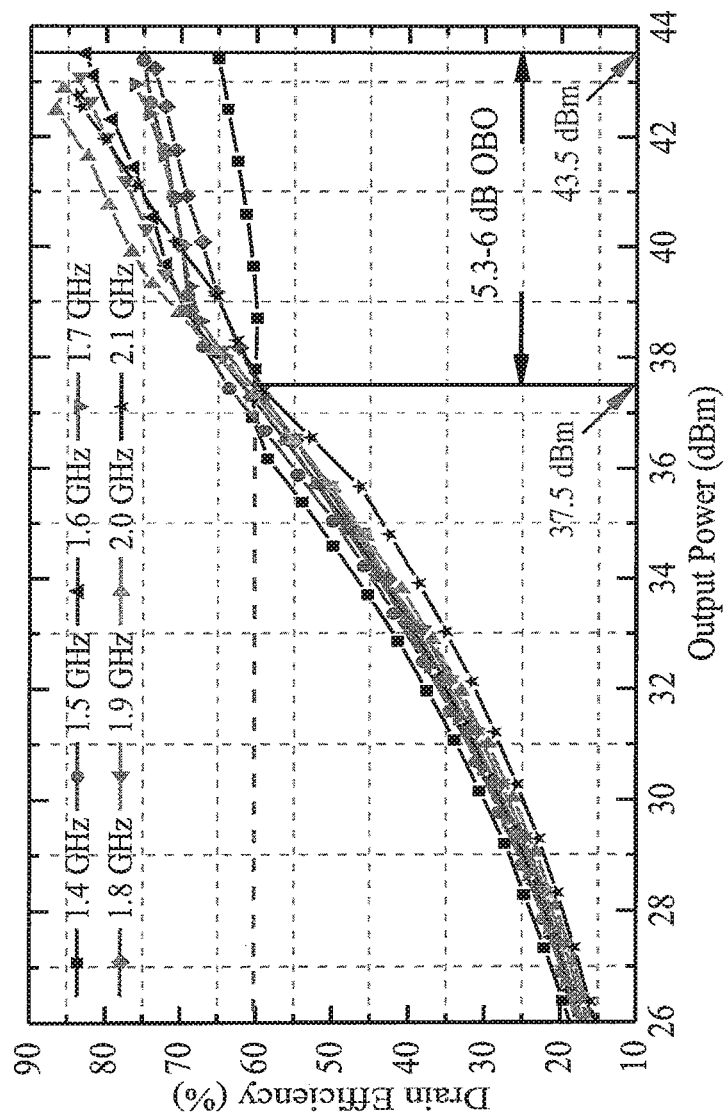
FIG. 9 is a graph showing the measured drain efficiency (%) versus output power (dBm) at different frequencies for the fabricated Doherty power amplifier of FIG. 8.

FIG. 9 shows the measured drain efficiencies of the fabricated Doherty power amplifier 200 of FIG. 8 with respect to the output power. It can be observed that Doherty behavior was successfully realized over the entire band, and exhibited higher than 60% drain efficiency (η) at 5.3-6 dB OBO (37.5 dBm) and 65% at saturation covering 700 MHz (1.4 GHz to 2.1 GHz).

Figure 10:
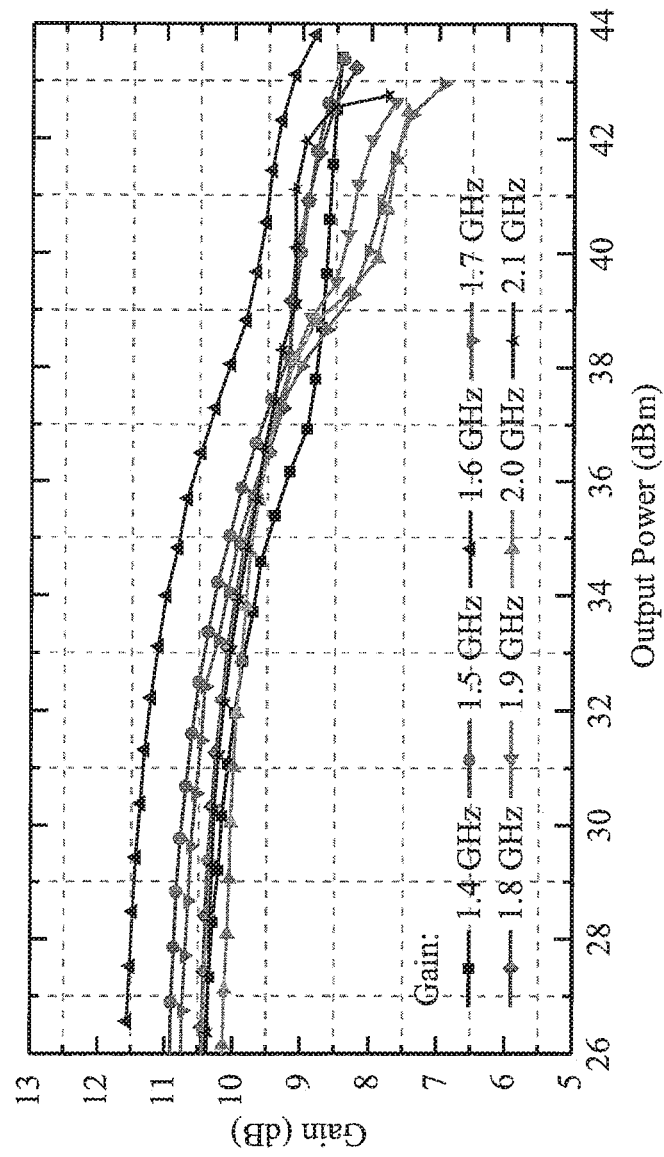
FIG. 10 is a graph showing the measured gain (dB) versus output power (dBm) at different frequencies for the fabricated Doherty power amplifier of FIG. 8.

FIG. 10 shows measured gain with respect to the output power of the fabricated Doherty power amplifier 200 of FIG. 8. The small signal gain varied from 11.5 dB to 10 dB with frequency, demonstrating flatten small signal gain. The gain compression at the back-off point and at saturation was less than 1.2 dB and 3.5 dB, respectively.

Figure 11A:
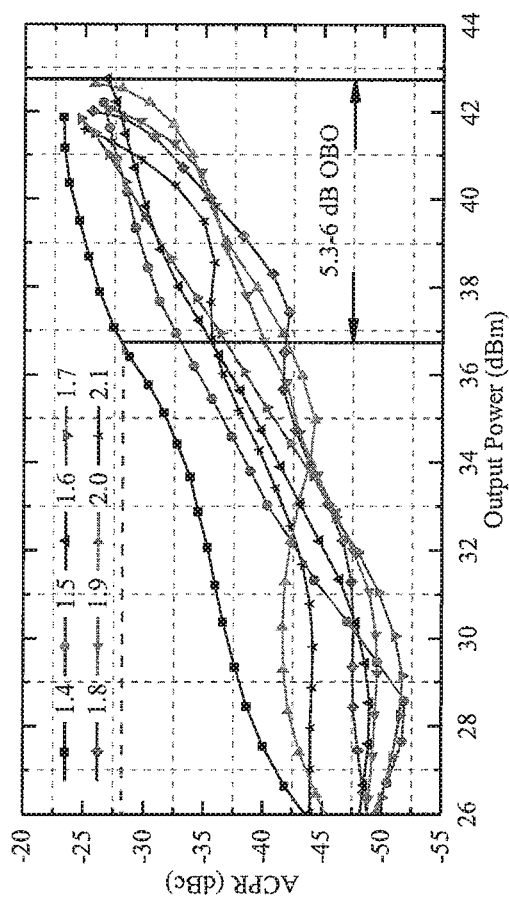
FIG. 11A is a graph showing the measured lower adjacent channel power ratio within entire operating frequency of the fabricated Doherty power amplifier of FIG. 8.
Figure 11B:
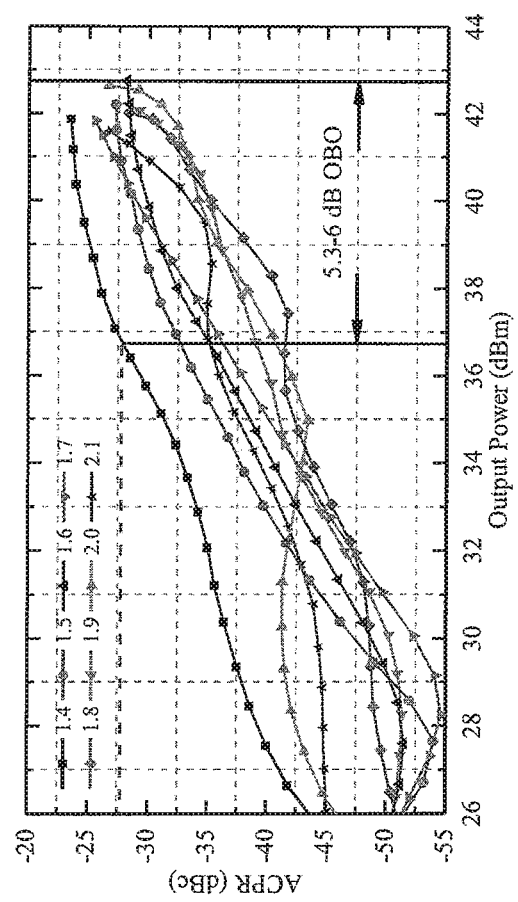
FIG. 11B is a graph showing the measured upper adjacent channel power ratio within entire operating frequency of the fabricated Doherty power amplifier of FIG. 8.

FIGS. 11A and 11B show measured adjacent channel power ratios (ACPRs) of the fabricated Doherty power amplifier 200 of FIG. 8 under modulated signal excitation. The lower and upper ACPR performance of the of the fabricated Doherty power amplifier 200 was better than −28 dBc and −27.2 dBc at 5.3-6 dB back-off from 1.4 to 2.1 GHz.

Figure 12:
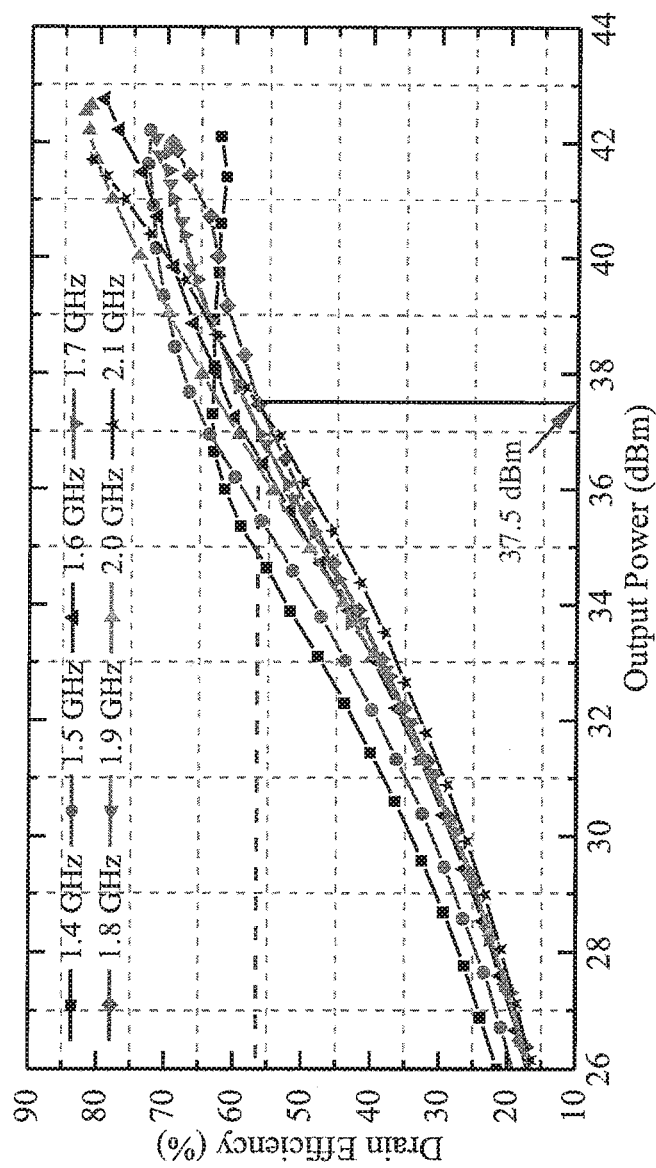
FIG. 12 is a graph showing the measured drain efficiency (%) versus output power (dBm) under modulated signals excitation for the fabricated Doherty power amplifier of FIG. 8.

FIG. 12 shows measured drain efficiencies using modulated signals with respect to the output power for the fabricated Doherty power amplifier 200 of FIG. 8. It can be observed that the average drain efficiency at 37.5 dBm (6 dB back-off point of CW measurement) was better than 57%, which is a bit lower than the results obtained with CW excitation. Average drain efficiency at 42 dBm (saturation) was better than 62.1%.

In the above embodiments of the invention, specific gate biases (deep Class-AB and deep Class C) are used, which give desirable high back-off efficiency and improved am-pm distortion. the harmonic injection network enhances the obo range that is potentially reduced by the specific gate biases. The phase compensation network provides electric coupling, which can effectively compensate for a potentially reduced bandwidth caused by the harmonic injection network. Careful combination of these various circuit arrangements has resulted in a Doherty power amplifier with wide bandwidth, high back-off efficiency and improved AM-PM distortion. The Doherty power amplifier can better utilize the second harmonic power generated by peaking and carrier amplifiers. The Doherty power amplifier has a wide operating bandwidth (40%), which can cover the frequency band of 4G and many of the upcoming 5G or further generations. The Doherty power amplifier has at least 60% efficiency at 6-dB back-off point. With the waveform amplitude modulation brought about by the dual harmonic injection technique, the saturated output power and the saturated efficiency of the Doherty power amplifier is increased. The low third-order trans-conductance generated by specific Deep Class-AB and Deep Class-C also operations improve the AM-PM distortion performance. The Doherty power amplifier has a high efficiency over a wide frequency range, which potentially allows the cost of power for base station power amplifiers to be significantly reduced.

The Doherty power amplifier of the above embodiments can be used in different applications and it can cover most wireless communication frequency bands such as those for base station and mobile handsets. For example, the power amplifiers in base station of 4G wireless communication systems adopt a modulated signal with 6.5 dB PAPR. The Doherty power amplifier of the above embodiment is well suited for this application as it can provide 60% efficiency at 6-dB back-off while covering a 40% bandwidth (1.4 GHz-2.1 GHz).

It will be appreciated by persons skilled in the art that the expressions "network" or the like are used in the description to refer to a circuit or circuit part, which can be form by any combination of transmission line, transmission line portions, or other active or inactive electronic circuit components. The term "offset line" can also be called an "offset transmission line". The term "main power amplification device", "carrier device", or the like, refers to a "carrier power amplifier" or "carrier amplifier". The term "auxiliary power amplification device", "peaking device", or the like, refers to a "peaking power amplifier" or "peaking amplifier". Unless otherwise specified, the term "connected", "engaged", "coupled with/to", or the like, may refer to direct or indirect connections, engagement, coupling, etc. The expression "Doherty power amplifier circuit" can be used to refer to a "Doherty power amplifier" or any parts of it.

Numerous variations and/or modifications may be made to the invention as shown in the specific embodiments without departing from the spirit or scope of the invention as broadly described. The present embodiments are, therefore, to be considered, in all respects, illustrative and not restrictive. In the above embodiments, the input side network of the Doherty power amplifier is not illustrated. In one example, the input side network includes an input power splitter connected at the input, and two parallel branches (one for carrier, one for peaking) connected with the output of the input power splitter. The first branch may include an offset line, an input matching network, DC block, stabilization network (SN), gate bias and drain bias for the carrier amplifier. The second branch may include an input matching network, a DC block, a stabilization network (SN), and gate bias and drain bias for the peaking amplifier. Of course, various modification and alteration can be made to the output side network of the Doherty power amplifier illustrated.

In some other embodiments, the form and dimension of the Doherty power amplifier circuit may vary for different applications. The use of main and auxiliary power amplification devices can be of any type and for different power applications. The output side network illustrated in the Figures can be of other form and construction, for different applications. The harmonic injection circuit need not be π-type topology, but instead can be of any topology with high pass or band pass frequency response. In some embodiments, the harmonic injection circuit need not provide 180° phase shirt, but can instead provide any phase shift that enables ±90° phase dispersion. The fundamental impedance inverters can be of any form of shape, not limited to L-type circuit topology. The phase compensation network can include any other form or structure. The single-end coupled transmission line section can be arranged differently, connected with different transmission lines sections having geometry and shape different from those illustrated. The first and second transmission line sections need not be parallel or collinear. The first and second transmission line sections can be one or more bends. The single-end coupled transmission line section can also having different shape, with more bends in some examples.

The invention claimed is:

1. A Doherty power amplifier comprising:
a main power amplification device with an output;
an auxiliary power amplification device with an output, and arranged in parallel with the main power amplification device; and
a load modulation circuit having a harmonic injection circuit connected with respective outputs of the main power amplification device and the auxiliary power amplification device;
wherein the harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation;
wherein the main power amplification device, when operated at saturation, has a relative current ratio defined by:
a second harmonic current generated by the main power amplification device divided by a second harmonic current generated by the auxiliary power amplification device, wherein the harmonic injection circuit is arranged such that the relative current ratio of the main power amplification device is larger than 1.

2. The Doherty power amplifier of claim 1, wherein the auxiliary power amplification device, when operated at saturation, has a relative current ratio defined by:
a second harmonic current generated by the auxiliary power amplification device divided by a second harmonic current generated by the main power amplification device;
wherein the harmonic injection circuit is arranged such that the relative current ratio of the auxiliary power amplification device is less than 1.

3. The Doherty power amplifier of claim 1, wherein the harmonic injection circuit is arranged to provide a phase shift of substantially 180°.

4. The Doherty power amplifier of claim 1, wherein the harmonic injection circuit includes a π-type circuit topology.

5. The Doherty power amplifier of claim 1, wherein the load modulation circuit further comprises:
a main fundamental impedance inverter connected with the main power amplification device; and
an auxiliary fundamental impedance inverter connected with the auxiliary power amplification device;
wherein the harmonic injection circuit is connected between the main fundamental impedance inverter and the auxiliary fundamental impedance inverter.

6. The Doherty power amplifier of claim 5, wherein the main fundamental impedance inverter has an L-type circuit topology.

7. The Doherty power amplifier of claim 5, wherein the auxiliary fundamental impedance inverter has an L-type circuit topology.

8. The Doherty power amplifier of claim 5, wherein the load modulation circuit further comprises a phase compensation circuit, connected between the main fundamental impedance inverter and the auxiliary fundamental impedance inverter, for compensating an inherent phase difference between the main power amplification device and the auxiliary power amplification device.

9. The Doherty power amplifier of claim 8, wherein the phase compensation circuit comprises a single-end coupled transmission line section.

10. The Doherty power amplifier of claim 9, wherein the single-end coupled transmission line section has an input impedance; the main power amplification device has a main load impedance at saturation; and the auxiliary power amplification device has an auxiliary load impedance at saturation; wherein the input impedance, the main load impedance at saturation, and the auxiliary load impedance at saturation are substantially identical.

11. The Doherty power amplifier of claim 10, wherein the phase compensation circuit further comprises a first transmission line section and a second transmission line section, the single-end coupled transmission line section being connected between the first transmission line section and the second transmission line section.

12. The Doherty power amplifier of claim 8, wherein the phase compensation circuit is formed by a continuous transmission line.

13. The Doherty power amplifier of claim 11, wherein the first transmission line section is elongated.

14. The Doherty power amplifier of claim 11, wherein the second transmission line section is elongated.

15. The Doherty power amplifier of claim 11, wherein the first and second transmission line sections are arranged in parallel.

16. The Doherty power amplifier of claim 11, wherein the single-end coupled transmission line section comprises:
a third transmission line section with a first end and a second end; and
a fourth transmission line section with a first end and a second end, arranged adjacent and in parallel with the third transmission line section;
wherein the first end of the third transmission line section is directly connected with the first transmission line section;
wherein the first end of the fourth transmission line section is directly connected with the second transmission line section; and
wherein the second end of the third transmission line section and the second end of the fourth transmission line section are directly connected with each other to provide the single-end coupling.

17. The Doherty power amplifier of claim 16, wherein the third transmission line section generally extends perpendicularly from the first transmission line section; and the fourth transmission line section generally extends perpendicularly from the second transmission line section.

18. The Doherty power amplifier of claim 1, wherein the main power amplification device is biased to operate as a Class AB amplifier.

19. The Doherty power amplifier of claim 1, the main power amplification device comprises a transistor.

20. The Doherty power amplifier of claim 1, wherein the auxiliary power amplification device is biased to operate as a Class C amplifier.

21. The Doherty power amplifier of claim 1, the auxiliary power amplification device comprises a transistor.

22. A Doherty power amplifier comprising:
a main power amplification device biased to operate as a Class AB amplifier, the main power amplification device having an output;
an auxiliary power amplification device biased to operate as a Class C amplifier, the auxiliary power amplification device having an output and arranged in parallel with the main power amplification device; and
a load modulation circuit having:
a main fundamental impedance inverter connected with the main power amplification device; and
an auxiliary fundamental impedance inverter connected with the auxiliary power amplification device;
a harmonic injection circuit connected with respective outputs of the main power amplification device and the auxiliary power amplification device and connected between the main fundamental impedance inverter and the auxiliary fundamental impedance inverter; wherein the harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation; and
a phase compensation circuit with a single-end coupled transmission line section, connected between the main fundamental impedance inverter and the auxiliary fundamental impedance inverter, for compensating an inherent phase difference between the main power amplification device and the auxiliary power amplification device.

23. The Doherty power amplifier of claim 22, wherein
the main power amplification device, when operated at saturation, has a relative current ratio defined by:
a second harmonic current generated by the main power amplification device divided by a second harmonic current generated by the auxiliary power amplification device;
the auxiliary power amplification device, when operated at saturation, has a relative current ratio defined by:
a second harmonic current generated by the auxiliary power amplification device divided by a second harmonic current generated by the main power amplification device;
wherein the harmonic injection circuit is arranged such that the relative current ratio of the main power amplification device is larger than 1 and the relative current ratio of the auxiliary power amplification device is less than 1.

24. The Doherty power amplifier of claim 22, wherein the harmonic injection circuit is arranged to provide a phase shift of substantially 180°.

25. The Doherty power amplifier of claim 22, wherein the harmonic injection circuit includes a $7t$-type circuit topology.

26. The Doherty power amplifier of claim 22, wherein the main fundamental impedance inverter has an L-type circuit topology; and the auxiliary fundamental impedance inverter has an L-type circuit topology.

27. The Doherty power amplifier of claim 22, wherein the single-end coupled transmission line section has an input impedance; the main power amplification device has a main load impedance at saturation; and the auxiliary power amplification device has an auxiliary load impedance at saturation; wherein the input impedance, the main load impedance at saturation, and the auxiliary load impedance at saturation are substantially identical.

28. The Doherty power amplifier of claim 27, wherein the phase compensation circuit further comprises a first transmission line section and a second transmission line section, the single-end coupled transmission line section being connected between the first transmission line section and the second transmission line section.

29. The Doherty power amplifier of claim 28, wherein the first and second transmission line sections are arranged in parallel.

30. The Doherty power amplifier of claim 29, wherein the single-end coupled transmission line section comprises:
a third transmission line section with a first end and a second end; and
a fourth transmission line section with a first end and a second end, arranged adjacent and in parallel with the third transmission line section;
wherein the first end of the third transmission line section is directly connected with the first transmission line section;
wherein the first end of the fourth transmission line section is directly connected with the second transmission line section; and
wherein the second end of the third transmission line section and the second end of the fourth transmission line section are directly connected with each other to provide the single-end coupling.

31. The Doherty power amplifier of claim 30, wherein the third transmission line section generally extends perpendicularly from the first transmission line section; and the fourth transmission line section generally extends perpendicularly from the second transmission line section.

32. The Doherty power amplifier of claim 22, wherein the phase compensation circuit is formed by a continuous transmission line.

33. A Doherty power amplifier comprising:
a main power amplification device with an output;
an auxiliary power amplification device with an output, and arranged in parallel with the main power amplification device; and
a load modulation circuit having a harmonic injection circuit connected with respective outputs of the main power amplification device and the auxiliary power amplification device;
wherein the harmonic injection circuit is arranged to provide a phase shift to simultaneously modulate transfer of second harmonic components generated at the main power amplification device to the auxiliary power amplification device and transfer of second harmonic components generated at the auxiliary power amplification device to the main power amplification device, when the main power amplification device and the auxiliary power amplification device are operated at saturation;
wherein the load modulation circuit further comprises:
a main fundamental impedance inverter connected with the main power amplification device;
an auxiliary fundamental impedance inverter connected with the auxiliary power amplification device; and
a phase compensation circuit with a single-end coupled transmission line section, connected between the main fundamental impedance inverter and the auxiliary fundamental impedance inverter, for compensating an inherent phase difference between the main power amplification device and the auxiliary power amplification device; and
wherein the harmonic injection circuit is connected between the main fundamental impedance inverter and the auxiliary fundamental impedance inverter.

34. The Doherty power amplifier of claim 33, wherein the single-end coupled transmission line section has an input impedance; the main power amplification device has a main load impedance at saturation; and the auxiliary power amplification device has an auxiliary load impedance at saturation; wherein the input impedance, the main load impedance at saturation, and the auxiliary load impedance at saturation are substantially identical.

35. The Doherty power amplifier of claim 34, wherein the phase compensation circuit further comprises a first transmission line section and a second transmission line section, the single-end coupled transmission line section being connected between the first transmission line section and the second transmission line section.

* * * * *

UNITED STATES PATENT AND TRADEMARK OFFICE
CERTIFICATE OF CORRECTION

PATENT NO.        : 11,043,920 B2
APPLICATION NO.   : 16/362788
DATED             : June 22, 2021
INVENTOR(S)       : Wing Shing Chan et al.

Page 1 of 1

It is certified that error appears in the above-identified patent and that said Letters Patent is hereby corrected as shown below:

In the Claims

Claim 25, Column 16, Line 50 is amended to read: "harmonic injection circuit includes a π-type circuit topol-"

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*